(12) United States Patent
Li et al.

(10) Patent No.: US 9,370,118 B2
(45) Date of Patent: Jun. 14, 2016

(54) PCB PLUG MECHANISM, FINISHED BOARD, AND SUBRACK

(71) Applicant: Huawei Technologies Co., Ltd., Shenzhen (CN)

(72) Inventors: Shuang Li, Hangzhou (CN); Lei Bai, Shenzhen (CN); Yan Su, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/542,046

(22) Filed: Nov. 14, 2014

(65) Prior Publication Data

US 2015/0070866 A1  Mar. 12, 2015

Related U.S. Application Data

(63) Continuation of application No. PCT/CN2012/086270, filed on Dec. 10, 2012.

(30) Foreign Application Priority Data

May 16, 2012 (CN) .......................... 2012 1 0151496

(51) Int. Cl.
*H05K 7/14* (2006.01)
*H05K 7/18* (2006.01)

(52) U.S. Cl.
CPC ............ *H05K 7/1452* (2013.01); *H05K 7/1409* (2013.01); *H05K 7/1418* (2013.01); *H05K 7/1425* (2013.01); *H05K 7/1461* (2013.01)

(58) Field of Classification Search
USPC ......... 361/727, 756, 755, 759, 797, 801–803; 439/64, 159, 160, 377, 641; 312/223.1, 312/223.2
See application file for complete search history.

(56) References Cited

U.S. PATENT DOCUMENTS

| | | | |
|---|---|---|---|
| 5,657,204 A | 8/1997 | Hunt | |
| 5,815,377 A | 9/1998 | Lund et al. | |
| 5,980,281 A | 11/1999 | Neal et al. | |
| 6,071,143 A | 6/2000 | Barthel et al. | |
| 6,162,073 A | 12/2000 | Haq et al. | |
| 6,288,911 B1 | 9/2001 | Aoki et al. | |
| 6,315,586 B1 | 11/2001 | Joyce et al. | |
| 6,406,322 B1 | 6/2002 | Barringer et al. | |
| 6,411,517 B1 | 6/2002 | Babin | |
| 6,667,890 B1 | 12/2003 | Barringer et al. | |
| 6,674,651 B2 | 1/2004 | Momiyama et al. | |
| 6,698,937 B2 | 3/2004 | Grimes et al. | |
| 6,930,892 B2 | 8/2005 | Barringer et al. | |
| 7,145,780 B2 | 12/2006 | Malone et al. | |

(Continued)

FOREIGN PATENT DOCUMENTS

| | | |
|---|---|---|
| CN | 101536622 A | 9/2009 |
| CN | 101801164 A | 8/2010 |

(Continued)

*Primary Examiner* — Hung S Bui
(74) *Attorney, Agent, or Firm* — Slater Matsil, LLP

(57) ABSTRACT

An embodiment of the present invention discloses a PCB board plug mechanism configured to implement hot plug of a PCB board, and including an output end that moves along a second direction when the input end moves. The second direction is at an angle with the first direction. The connector for connecting the to-be-plugged PCB board is disposed at the output end. In a process in which the output end moves along the second direction, the PCB board can be driven to perform a corresponding hot plug action.

18 Claims, 5 Drawing Sheets

(56) References Cited

U.S. PATENT DOCUMENTS

| | | |
|---|---|---|
| 7,215,556 B2 | 5/2007 | Wrycraft |
| 7,265,968 B2 | 9/2007 | Champion et al. |
| 7,283,371 B1 | 10/2007 | Grouell et al. |
| 7,297,015 B1 | 11/2007 | Desrosiers et al. |
| 7,420,816 B2 | 9/2008 | Rubenstein |
| 7,435,114 B2 | 10/2008 | Desrosiers et al. |
| 7,663,889 B2 * | 2/2010 | Lajara .................. G06F 1/185 361/748 |
| 2008/0068813 A1 | 3/2008 | Rubenstein |
| 2008/0264192 A1 | 10/2008 | Christensen |
| 2011/0292620 A1 | 12/2011 | Hayashi et al. |
| 2012/0099284 A1 | 4/2012 | Boetzer |
| 2012/0240704 A1 | 9/2012 | Li et al. |
| 2014/0254086 A1 | 9/2014 | Li et al. |

FOREIGN PATENT DOCUMENTS

| | | |
|---|---|---|
| CN | 101873781 A | 10/2010 |
| CN | 101976785 A | 2/2011 |
| CN | 201845266 U | 5/2011 |
| CN | 102709793 A | 10/2012 |
| CN | 102738653 A | 10/2012 |
| CN | 102738685 A | 10/2012 |
| CN | 102761022 A | 10/2012 |

* cited by examiner

PCB PLUG MECHANISM, FINISHED BOARD, AND SUBRACK

This application is a continuation of International Application No. PCT/CN2012/086270, filed on Dec. 10, 2012, which claims priority to Chinese Patent Application No. 201210151496.3, filed on May 16, 2012, both of which are hereby incorporated by reference in their entireties.

TECHNICAL FIELD

The present invention relates to the field of PCI-E card technologies, and in particular, to a PCB board plug mechanism.

BACKGROUND

A PCI (Peripheral Component Interconnect) Express card is a bus interface board used to interconnect peripheral devices in a computer or communication platform application or the like, and is commonly used in a product, such as a server. A PCI Express interface varies according to a different bus bit width, and includes X1, X4, X8, and X16. A short PCI Express card may be inserted in a long PCI Express slot for use.

A PCI-E card (PCI Express card) has a series of standards, including a shape and a size, and can be directly purchased for use. To enhance system maintainability and meet an assembly requirement or the like, a product, such as a server, usually has a hot plug requirement for a PCI-E card, and a circuit of the PCI-E card also supports hot plug.

A connector of a PCI-E card is also called an edge connector and is at an edge adjacent to a plane where a panel is located, and a non-conventional board is at an edge opposite to the plane where the panel is located. Therefore, to meet a hot plug requirement in a position of the panel, a two-dimensional moving mechanism must be used for implementation. Because of a special shape, a PCI-E card cannot be directly plugged in and out in a position of the panel. According to a conventional installation manner, a shelf needs to be taken out, and then the PCI-E card needs to be plugged out from the top after a cover of the shelf is opened, which cannot meet a requirement of a device for hot plug without power interruption and without service interruption.

Therefore, how to develop a PCB board plug mechanism to implement a hot plug operation for a PCI-E card directly in a position of a panel under a precondition of no power interruption and no service interruption becomes an important technical problem to be urgently addressed by a person skilled in the art.

SUMMARY

An objective of the present invention is to provide a PCB board plug mechanism, so as to implement a hot plug operation directly in a position of a panel under a precondition of no power interruption and no service interruption in a system.

Another objective of the present invention is to provide a finished board that has the foregoing PCB board plug mechanism.

Still another objective of the present invention is to provide a subrack that has the foregoing finished board.

To implement the foregoing objectives, the present invention provides the following technical solutions:

A PCB board plug mechanism is configured to implement hot plug of a PCB board, and includes an input end that can move along a first direction under an external force and an output end that moves along a second direction when the input end moves. The second direction is at an angle with the first direction. The second direction is a plug direction of the PCB board, a connector for connecting the to-be-plugged PCB board is disposed at the output end. In a process in which the output end moves along the second direction, the connector drives the PCB board to perform a corresponding hot plug action.

A finished board includes a mother board and a to-be-plugged PCB board, and further includes a carrier board that is disposed on the mother board in a slidable manner. The to-be-plugged PCB board is disposed on the carrier board. A plug mechanism that drives the carrier board to slide along a sliding direction of the carrier board. The plug mechanism is a PCB board plug mechanism described above. An input end of the plug mechanism is located on an external side of the mother board, and an output end of the plug mechanism is connected to the carrier board.

A subrack includes a subrack body, a guide rail disposed on a mother board of the subrack body, and a finished board that cooperates with the guide rail on sliding, where the finished board is the finished board mentioned above.

It can be seen from the foregoing technical solutions that, according to the PCB board plug mechanism provided in the embodiments of the present invention, it can be ensured that a hot plug operation is implemented directly in a position of a panel under a precondition of no power interruption and no service interruption in a system. Specifically, in the hot plug operation, an input end can be driven to move along a corresponding direction; and in a process in which the input end moves, an output end is driven to move along a direction perpendicular to the movement direction of the input end, and the output end drives a PCB board to perform a corresponding hot plug action. In the embodiments of the present invention, movement directions of the input end and the output end are perpendicular to each other. Therefore, an input direction is kept away from a movement direction of the PCB board, so that the plug mechanism can be disposed more easily.

BRIEF DESCRIPTION OF THE DRAWINGS

To describe the technical solutions in the embodiments of the present invention or in the prior art more clearly, the following briefly introduces the accompanying drawings required for describing the embodiments or the prior art. Apparently, the accompanying drawings in the following description show merely some embodiments of the present invention, and a person of ordinary skill in the art may still derive other drawings from these accompanying drawings without creative efforts.

DETAILED DESCRIPTION OF ILLUSTRATIVE EMBODIMENTS

Figure 1:
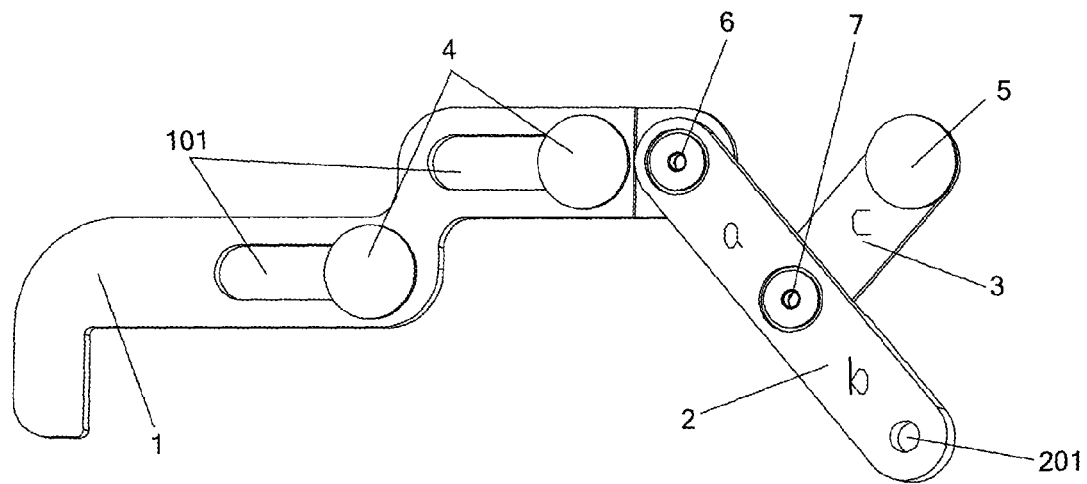
FIG. 1 is a schematic structural diagram of a PCB board plug mechanism according to an embodiment of the present invention.
Figure 2:
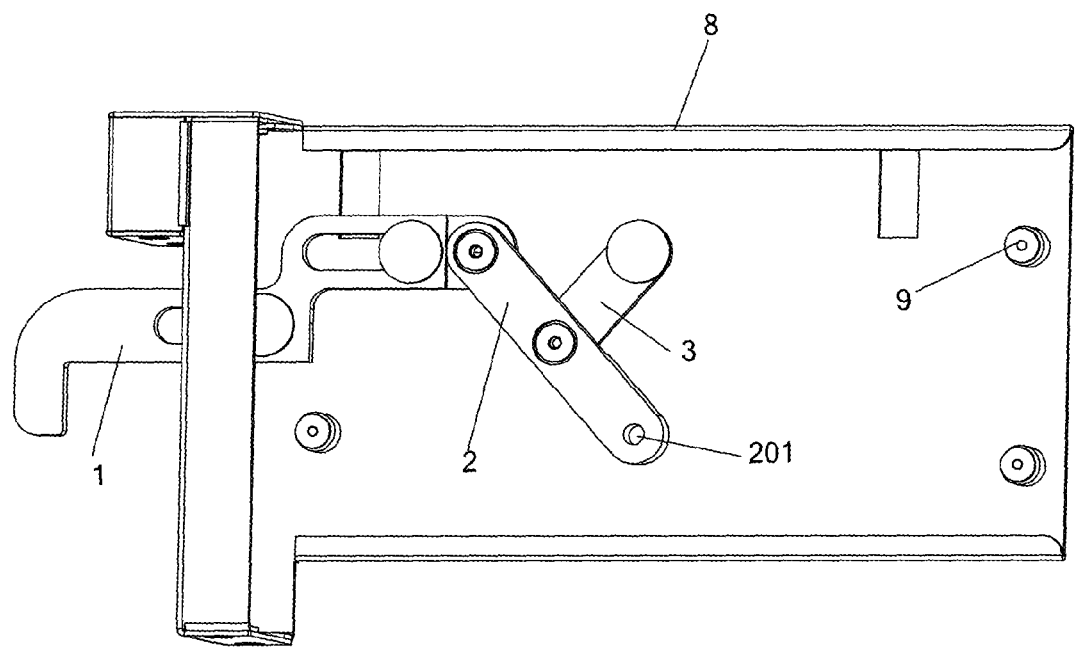
FIG. 2 is a schematic structural diagram of a PCB board plug mechanism installed on a mother board according to an embodiment of the present invention.

A core of the present invention is that a PCB board plug mechanism is provided, so as to implement a hot plug operation directly in a position of a panel under a precondition of no power interruption and no service interruption in a system.

The following clearly describes the technical solutions in the embodiments of the present invention with reference to the accompanying drawings in the embodiments of the present invention. Apparently, the described embodiments are merely a part rather than all of the embodiments of the present invention. All other embodiments obtained by a person of ordinary skill in the art based on the embodiments of the present invention without creative efforts shall fall within the protection scope of the present invention.

A PCB board plug mechanism disclosed in an embodiment of the present invention is configured to implement hot plug of a PCB board, and includes an input end and an output end.

The input end can move along a first direction under an external force. Specifically, when the plug mechanism is installed, the input end may be located outside a device, so as to drive the plug mechanism to implement plug of a PCI-E card. In a process in which the input end moves, the output end can move along a second direction that forms an angle with the first direction. The second direction is a plug direction of the PCB board. A connector for connecting the to-be-plugged PCB board is disposed at the output end. The connector can connect the PCB board to the output end, and in a process in which the output end moves along the second direction, the PCB board can be driven to perform a corresponding hot plug action. In the embodiment of the present invention, movement directions of the input end and the output end are designed to be directions perpendicular to each other, with an objective of facilitating disposal of the plug mechanism, so as to ensure that operating of the mechanism is steadier.

According to the PCB board plug mechanism provided in the embodiment of the present invention, a hot plug operation can be implemented directly in a position of a panel under a precondition of no power interruption and no service interruption in a system. Specifically, in the hot plug operation, an input end can be driven to move along a corresponding direction; and in a process in which the input end moves, an output end is driven to move along a direction perpendicular to the movement direction of the input end, and the output end drives a PCB board to perform a corresponding hot plug action. In the embodiment of the present invention, the movement directions of the input end and the output end are perpendicular to each other. Therefore, an input direction is kept away from a movement direction of the PCB board, so that the plug mechanism can be disposed more easily.

The PCB board plug mechanism provided in the embodiment of the present invention may be a wedge mechanism, that is, includes a first moving push plate and a second moving push plate of a triangular structure that are in contact at a slope. A person skilled in the art may understand that, when the first moving push plate is pushed horizontally, the second moving push plate completes vertical movement. That is, to implement a plug action of a PCB board in a vertical direction, the first moving push plate can be pushed horizontally for implementation. To implement that when the first moving push plate is pulled back horizontally, the second moving push plate can complete a position restoration action (the second moving push plate may be connected to the PCB board, and in a process in which a position of the second moving push plate is restored, an action of plugging the PCB board out of a slot is implemented), a position restoration spring may be disposed on the second moving push plate, or an occluding guide rail is disposed at the slope where the first moving push plate is in contact with the second moving push plate.

Referring to FIG. 1, FIG. 1 is a schematic structural diagram of a PCB board plug mechanism according to an embodiment of the present invention.

A PCB board plug mechanism provided in another embodiment of the present invention is a connecting rod mechanism, and specifically includes a tie bar 1, a swing rod 2, and a position limiting rod 3.

A first guiding mechanism is disposed on the tie bar 1, and one end of the tie bar 1 forms an input end. An extended guiding direction of the first guiding mechanism is perpendicular to a plug direction of a to-be-plugged PCB board, and the first guiding mechanism is configured to ensure that the tie bar 1 can move only along a direction perpendicular to the plug direction of the to-be-plugged PCB board.

One end of the swing rod 2 is hinge-connected to the other end of the tie bar 1 by using a first hinge 6, the other end of the swing rod 2 forms an output end 201, and the output end 201 is configured to connect to the PCB board. One end of the position limiting rod 3 is hinge-connected to the swing rod 2 by using a second hinge 7, the other end of the position limiting rod 3 forms an installation end by using a first fastening pin 5, and a distance a between the first hinge 6 and the second hinge 7, a distance b between the second hinge 7 and the output end 201, and a distance c between the second hinge 7 and the first fastening pin 5 are equal.

As shown in FIG. 1, when the input end of the tie bar 1 is pulled, the tie bar 1 moves along a horizontal direction under a position limiting effect of the guiding mechanism, the swing rod 2 moves under double limits of the tie bar 1 and the position limiting rod 3, and the output end 201 of the swing rod 2 moves with the swing rod 2. When the distance a, the distance b, and the distance c are equal, the output end 201 of a moving rod 2 implements movement along a vertical direction, that is, the PCB board can be driven to implement vertical movement. Likewise, if the PCB board is expected to move horizontally, the guiding mechanism of the tie bar 1 only needs to be disposed vertically.

In this embodiment, the first guiding mechanism may include a first conduit 101 provided on the tie bar 1 and a second fastening pin 4 that is disposed in the first conduit 101 and can slide relative to the first conduit 101. If the PCB board is expected to move vertically, the first conduit needs to extend horizontally according to a requirement. In the embodiment of the present invention, relative movement of the first conduit 101 and the second fastening pin 4 implements a guiding effect. In specific disposal, the second fastening pin 4 may be fastened on a panel that is fastened.

To prevent the first conduit 101 on the tie bar 1 from rotating along the second fastening pin 4, a manner of a molded-surface connection may be used, or the first conduit 101 is designed to be at least two segments that are provided in parallel. By setting the first conduit 101 to be two segments or more than two segments that are parallel to one another, rotation of the first conduit 101 along the second fastening pin 4 can be limited. In this embodiment, the output end 201 of the swing rod 3 may be a fastening hole, and the PCB board is connected to the swing rod 3 by cooperation of the fastening pin and the fastening hole.

Figure 3:
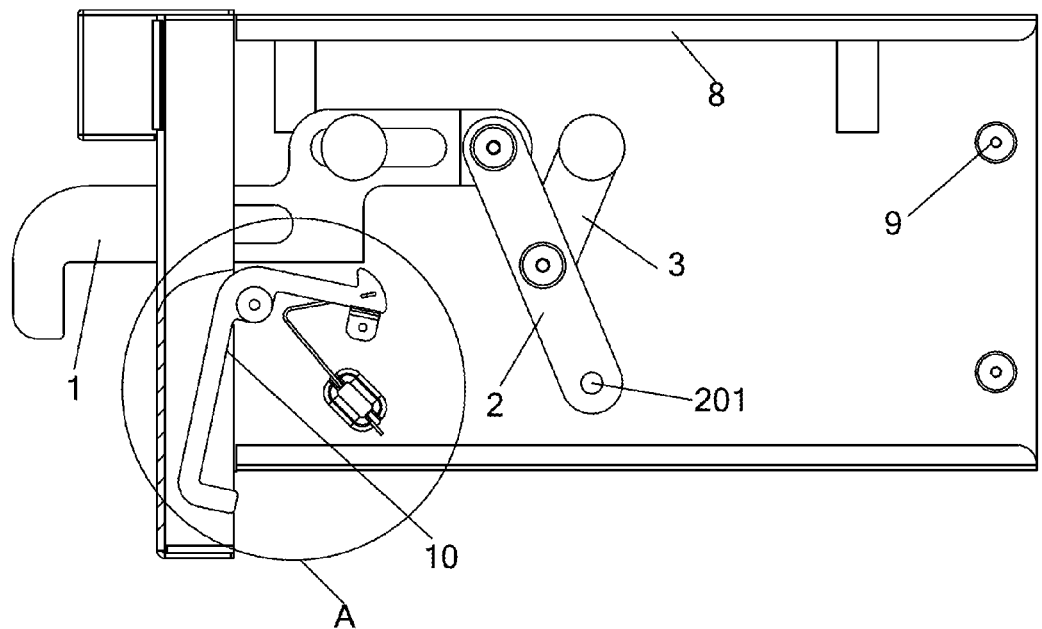
FIG. 3 is a schematic structural diagram of a mother board disposed with a plug mechanism and a locking mechanism according to an embodiment of the present invention.
Figure 4:
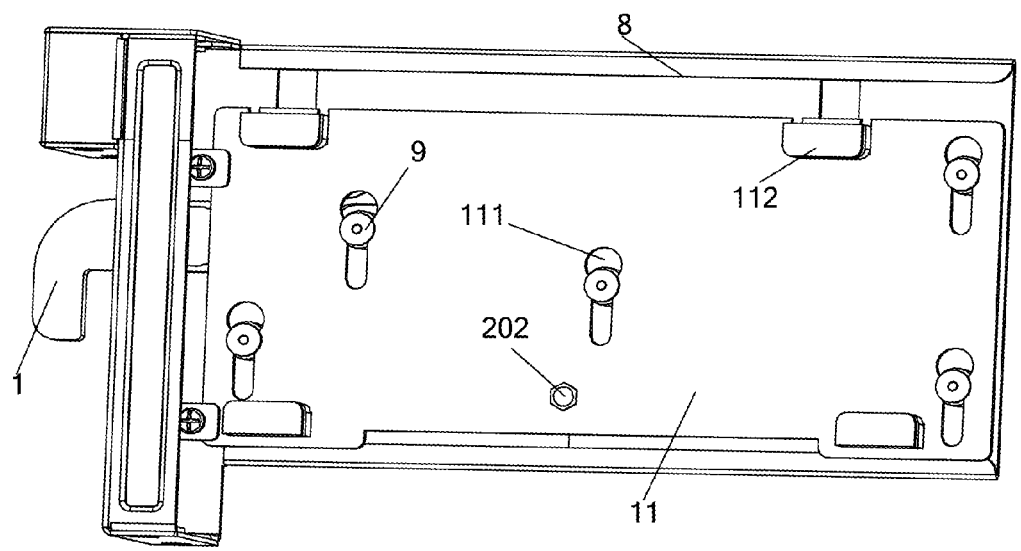
FIG. 4 is a schematic structural diagram of a carrier board installed on a mother board according to an embodiment of the present invention.
Figure 5:
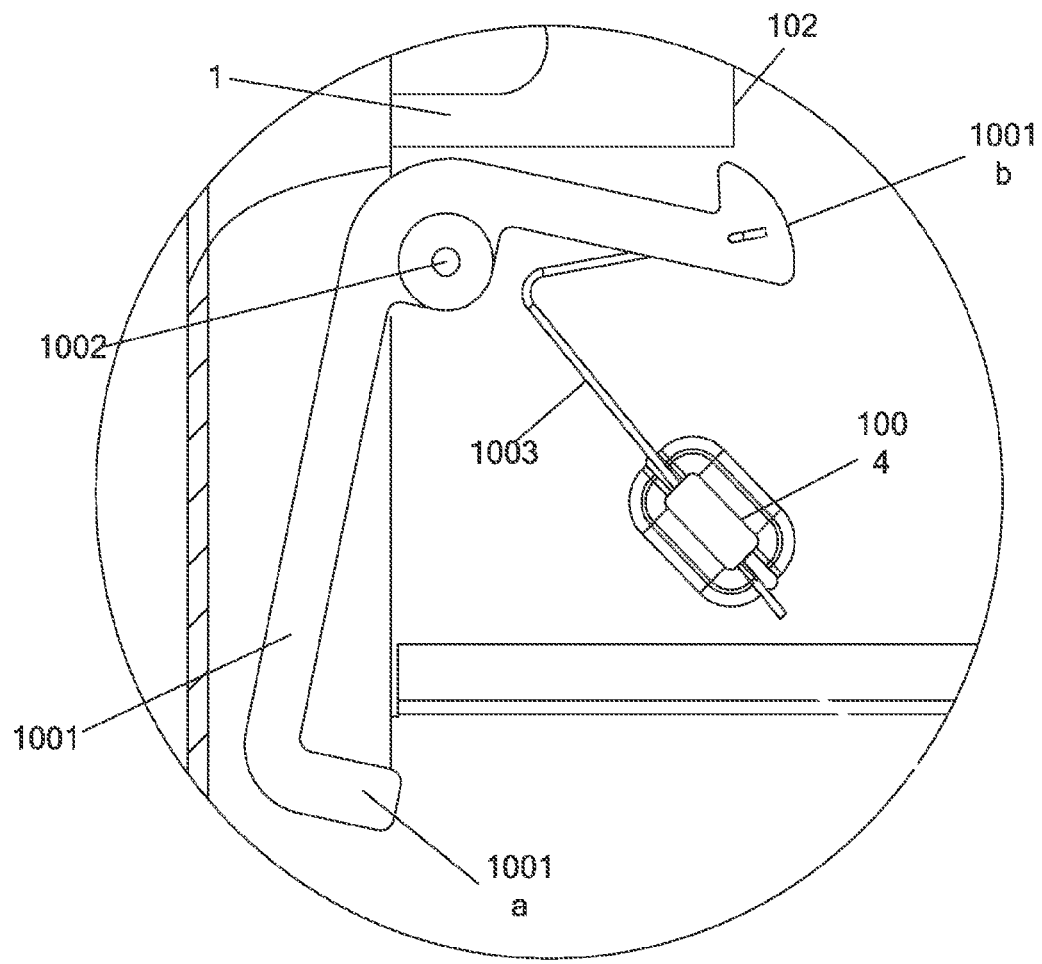
FIG. 5 is a locally enlarged view of A in FIG. 3.
Figure 6:
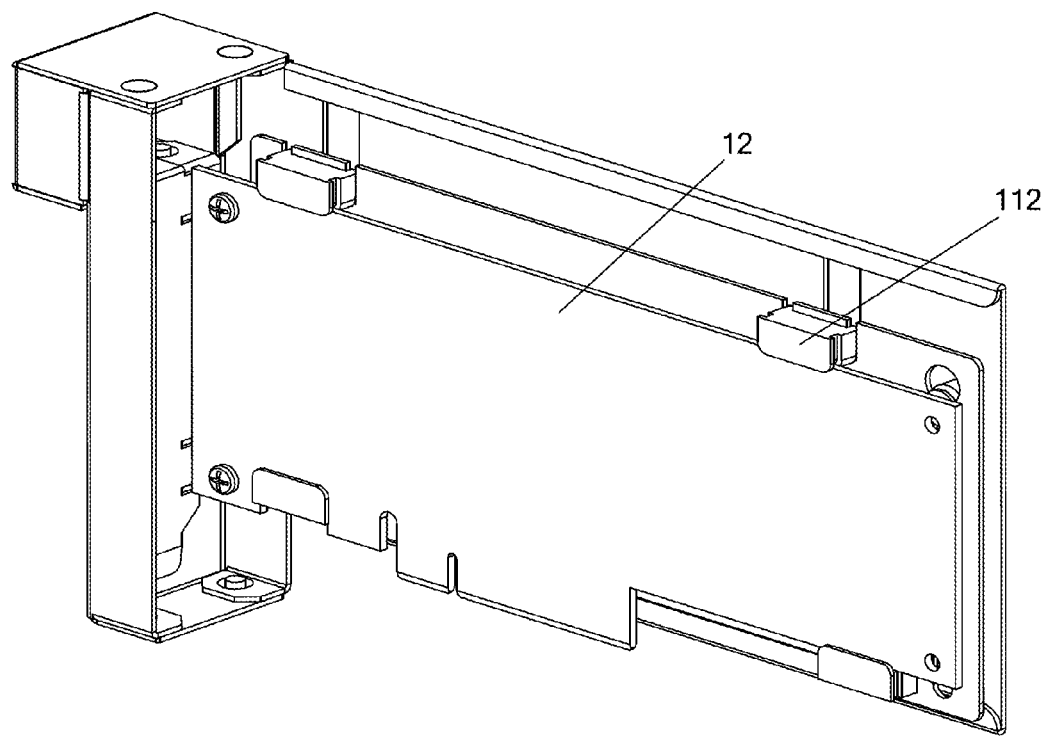
FIG. 6 is a schematic structural diagram of a finished board according to an embodiment of the present invention.

Referring to FIG. 2 to FIG. 6, FIG. 2 is a schematic structural diagram of a PCB board plug mechanism installed on a mother board according to an embodiment of the present invention; FIG. 3 is a schematic structural diagram of a mother board disposed with a plug mechanism and a locking mechanism according to an embodiment of the present invention; FIG. 4 is a schematic structural diagram of a carrier board installed on a mother board according to an embodiment of the present invention; FIG. 5 is a locally enlarged view of A in FIG. 3; and FIG. 6 is a schematic structural diagram of a finished board according to an embodiment of the present invention.

The finished board provided in the embodiment of the present invention includes a mother board 8 and a to-be-plugged PCB board 12, and in addition, further includes a carrier board 11 and a plug mechanism.

The carrier board 11 can be disposed on the mother board 8 in a sliding manner, the to-be-plugged PCB board 12 is disposed on the carrier board 11, and the carrier board 11 is configured to carry the to-be-plugged PCB board 12. The plug mechanism is configured to drive the carrier board 11 to slide along a sliding direction of the carrier board 11, and the plug mechanism is the PCB board plug mechanism disclosed in the foregoing embodiment. An input end of the plug mechanism is located on an external side of the mother board 8, so as to facilitate an external operation, and an output end of the plug mechanism is connected to the carrier board 11.

In a specific embodiment of the present invention, the plug mechanism specifically includes a tie bar 1, a swing rod 2, and a position limiting rod 3.

A first guiding mechanism is disposed on the tie bar 1, and one end of the tie bar 1 forms an input end. An extended guiding direction of a first guiding mechanism is perpendicular to a plug direction of a to-be-plugged PCB board 12, and the first guiding mechanism is configured to ensure that the tie bar 1 can move only along a direction perpendicular to the plug direction of the to-be-plugged PCB board 12.

One end of the swing rod 2 is hinge-connected to the other end of the tie bar 1 by using a first hinge 6, the other end of the swing rod 2 forms an output end 201, and the output end 201 is configured to jointly connect the carrier board 11 by using a third fastening pin 202. One end of the position limiting rod 3 is hinge-connected to the swing rod 2 by using a second hinge 7, the other end of the position limiting rod 3 is hinge-connected to the mother board 8 by using a first fastening pin 5, and a distance a between the first hinge 6 and the second hinge 7, a distance b between the second hinge 7 and the output end 201, and a distance c between the second hinge 7 and the first fastening pin 5 are equal.

As shown in FIG. 3, because the other end of the position limiting rod 3 is hinge-connected to the mother board 8 by using the first fastening pin 5, the position limiting rod 3 cannot perform movement along a horizontal or vertical direction, and can only rotate along the first fastening pin 5. When the tie bar 1 is located at an input end outside the mother board 8, the tie bar 1 moves along a horizontal direction under a position limiting effect of the guiding mechanism, the swing rod 2 moves under double limits of the tie bar 1 and the position limiting rod 3, and the output end 201 of the swing rod 3 moves with the swing rod 3. When the distance a, the distance b, and the distance c are equal, the output end 201 of a moving rod 3 implements movement along a vertical direction, that is, the carrier board 11 can be driven to implement vertical movement. Likewise, if the to-be-plugged PCB board 12 is expected to move horizontally, the guiding mechanism of the tie bar 1 only needs to be disposed vertically.

In this embodiment, the first guiding mechanism may include a first conduit 101 provided on the tie bar 1 and a second fastening pin 4 that is disposed in the first conduit 101 and can slide relative to the first conduit 101, and the second fastening pin 4 is fastened on the mother board 8. If the to-be-plugged PCB board 12 is expected to move vertically, the first conduit 101 needs to extend horizontally according to a requirement. In the embodiment of the present invention, relative movement of the first conduit 101 and the second fastening pin 4 implements a guiding effect.

To prevent the first conduit 101 on the tie bar 1 from rotating along the second fastening pin 4, a manner of a molded-surface connection may be used, or the first conduit 101 is at least two segments that are provided in parallel. By setting the first conduit 101 to be two segments or more than two segments that are parallel to one another, rotation of the first conduit 101 along the second fastening pin 4 can be limited. In this embodiment, the output end 201 of the swing rod 3 may be a fastening hole, and the to-be-plugged PCB board 12 is connected to the swing rod 3 by cooperation of the fastening pin and the fastening hole.

As shown in FIG. 4, to implement that the carrier board 11 moves along a movement direction of the to-be-plugged PCB board 12, a guiding mechanism also needs to be configured. In this embodiment, the guiding mechanism is a second conduit 111 provided on the carrier board 11, several fourth fastening pins 9 are disposed on the mother board 8, the fourth fastening pins 9 cooperate with the second conduit 111 on the carrier board 11, and an extending direction of the second conduit 111 is the same as a plug direction of the to-be-plugged PCB board 12. When the carrier board 11 is driven to move, relative movement occurs between the second conduit 111 and the fourth fastening pins 9.

To prevent the carrier board 11 from rotating, in this embodiment, more than one second conduit 111 is provided in parallel. In this embodiment, plug movement of the to-be-plugged PCB board 12 along a vertical direction needs to be implemented. Therefore, the extending direction of the second conduit 111 is the vertical direction.

In this embodiment, several PCB board card slots 112 are provided on the carrier board 11, and the to-be-plugged PCB board 12 is disposed on the carrier board 11 by using the PCB board card slots 112.

In a process in which the finished board is plugged in and plugged out along a guide rail, the carrier board 11 with the to-be-plugged PCB board 12 needs to be in an upper position along the vertical direction (in this embodiment, a slot for hot plug of the to-be-plugged PCB board 12 is provided in a lower position along the vertical direction), so as to prevent the carrier board 11 from colliding with a backplane connector of the to-be-plugged PCB board 12. In this embodiment, a locking mechanism 10 that is disposed on the mother board 8 and configured to prevent the carrier 11 from automatically sliding off is further included.

When the locking mechanism 10 disclosed in this embodiment is in a locked state, the carrier board 11 is locked in a position on an upper part of the mother board 8. The carrier board 11 can be unlocked to implement plug movement along the vertical direction only when a position requiring plug is reached.

The locking mechanism 10 disclosed in a specific embodiment of the present invention includes a locking rod 1001 and a clamp spring 1003.

The locking rod 1001 is hinge-connected to the mother board 8, one end of the locking rod 1001 is a clamp end 1001b, the other end of the locking rod 1001 is a rotating driving end 1001a that extends externally to the mother board 8, and an effect of the rotating driving end 1001*a* is to rotate the locking rod 1001 under an external force, so as to ensure that the clamp end 1001*b* gets out of a locked state.

One end of the clamp spring 1003 is disposed on the mother board 8, the other end is pressed against the clamp end 1001*b* of the locking rod 1001, and under an elastic effect of the clamp spring 1003, the clamp end 1001*b* is fastened to a fastening end 102 of the tie bar 1. An effect of the clamp spring 1003 is to ensure that the clamp end 1001*b* is always fastened to the fastening end 102, so as to be in a locked state. The clamp spring 1003 can be compressed only when the rotating driving end 1001*a* is driven to rotate, so that the clamp end 1001*b* gets out of a fastened state with the fastening end 102.

A convex hull 1004 is disposed on the mother board 8, and one end of the clamp spring 1003 is disposed on the mother board 8 by passing through a fastening hole on the convex hull 1004. That is, in this embodiment, one end of the clamp spring 1003 is fastened on the mother board 8 by using the convex hull 1004. The fastening manner using the convex hull better facilitates assembly and disassembly. Another fastening manner may also be used in the embodiment of the present invention, which is not limited herein.

Figure 7:
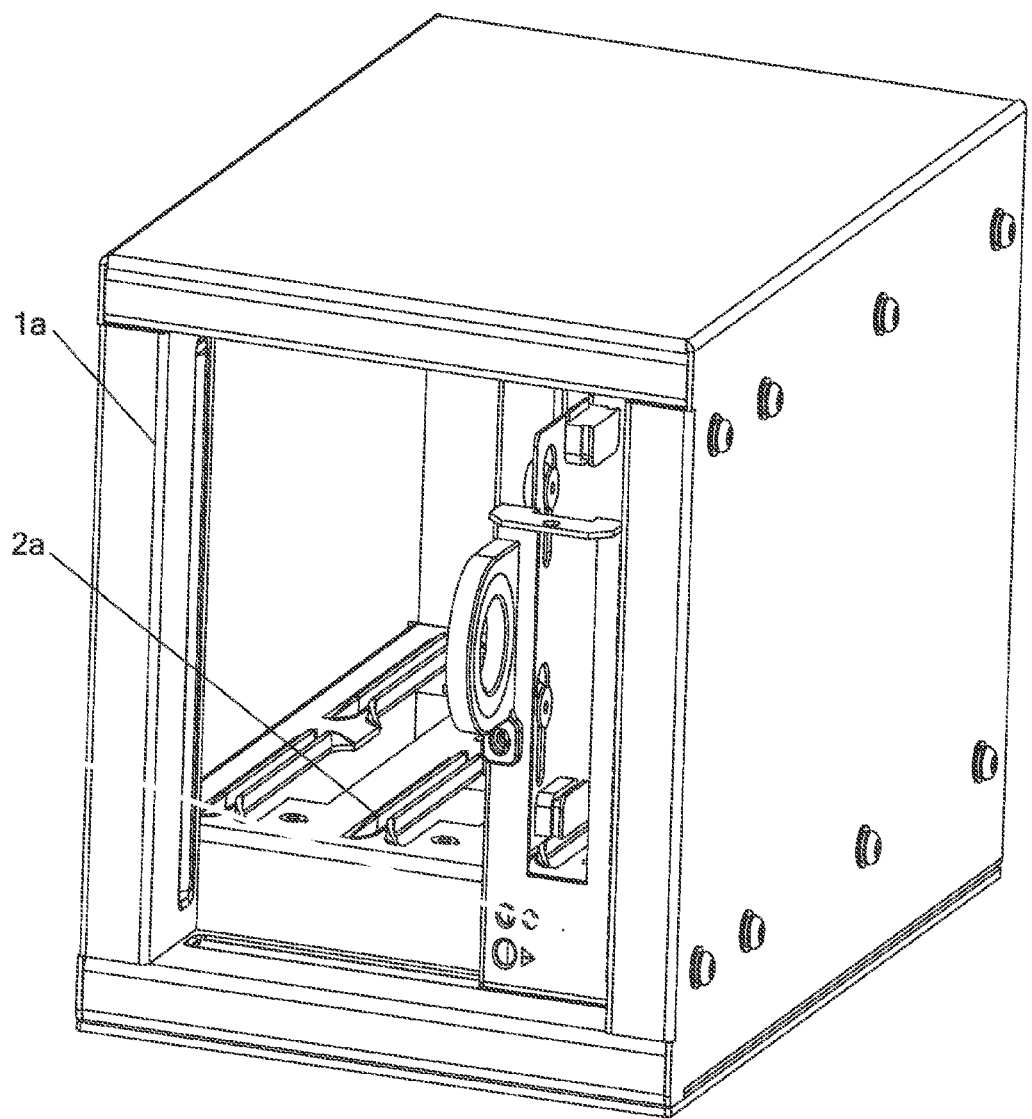
FIG. 7 is a schematic structural diagram of a subrack according to an embodiment of the present invention.

Referring to FIG. 7, FIG. 7 is a schematic structural diagram of a subrack according to an embodiment of the present invention.

The subrack provided in the embodiment of the present invention includes a subrack body 1*a*, a guide rail 2*a* disposed on a mother board of the subrack body 1*a*, and a finished board that is disclosed in the foregoing embodiment and cooperates with the guide rail 2*a*. The subrack disclosed in this embodiment uses the finished board disclosed in the foregoing embodiment. Therefore has all technical effects of the foregoing finished board are provided, and details are not repeatedly described in this embodiment.

In this embodiment, a contact convex pad (the contact convex pad may be the subrack body 1*a* or the guide rail 2*a*) cooperating with a rotating driving end 1001*a* of a locking mechanism 10 on contacting is disposed on the subrack body 1*a*, and after the finished board is installed in position along the guide rail 2*a*, the rotating driving end 1001*a* gets in contact with the contact convex pad, bears a force, and makes a clamp end 1001*b* rotate until the clamp end 1001*b* is detached from a fastening end 102 of a tie bar 1.

When the finished board is installed on the guide rail 2*a*, the clamp end 1001*b* of a locking rod 1001 is clamped at the fastening end 102 of the tie bar 1. In this case, the tie bar 1 cannot move horizontally. When the finished board continues being installed, the rotating driving end 1001*a* of the locking rod 1001 gets in contact with the contact convex pad and bears a force, and the locking rod 1001 swings around a hinge point (a hinge shaft 1002), so that the clamp end 1001*b* is gradually detached from the fastening end 102 of the tie bar 1. After the finished board is completely installed in position, the clamp end 1001*b* is completely detached from the fastening end 102. In this case, the tie bar 1 is pushed, and the tie bar 1 moves horizontally. Under a driving force of the tie bar 1 and a position limiting effect of a position limiting rod 3, a swing rod 2 swings around the hinge point, and a carrier board 11 with a to-be-plugged PCB board 12 is driven by a fourth fastening pin 9 to move downward vertically, so that the to-be-plugged PCB board 12 is finally plugged in a backplane. Conversely, the finished board can be taken out.

The embodiments in this specification are described in a progressive manner. The focus of each embodiment is placed on a difference from other embodiments. The same or similar parts of the embodiments can be referenced mutually.

The foregoing descriptions of the disclosed embodiments help a person skilled in the art implement or use the present invention. Various modifications to these embodiments are apparent to a person skilled in the art. The general principle defined in this specification applies to other embodiments without departing from the spirit or scope of the present invention. Therefore, the scope of the present invention extends to any embodiments that comply with the principle and new features disclosed in this specification, and is not limited to the embodiments disclosed in this specification.

What is claimed is:

1. A PCB plug mechanism comprising
    a tie bar comprising a first end and a second end, the first end forming an input end of the PCB plug mechanism that moves along a first direction under an external force;
    a swing rod, wherein one end of the swing rod is hinge-connected to the second end of the tie bar by using a first hinge, and the other end of the swing rod forms an output end of the PCB plug mechanism, wherein the output end moves along a second direction when the input end moves in the first direction, wherein the second direction is at an angle with the first direction, wherein the second direction is a plug direction of the PCB; and
    a connector for connecting the PCB is disposed at the output end, wherein in a process in which the output end moves along the second direction, the connector drives the PCB to perform a corresponding hot plug action.

2. The PCB plug mechanism according to claim 1, comprising:
    wherein a first guiding mechanism is disposed on the tie bar, an extended guiding direction of the first guiding mechanism is perpendicular to the plug direction of the to-be-plugged PCB, and the extended guiding direction of the first guiding mechanism is the first direction; and
    a position limiting rod, wherein one end of the position limiting rod is hinge-connected to the swing rod by using a second hinge, the other end of the position limiting rod forms an installation end by using a first fastening pin.

3. The PCB plug mechanism according to claim 2, wherein the first guiding mechanism comprises a first conduit provided on the tie bar and a second fastening pin that is disposed in the first conduit and can slide relative to the first conduit.

4. The PCB plug mechanism according to claim 3, wherein the first conduit is at least two segments that are provided in parallel.

5. The PCB plug mechanism according to claim 2, wherein a distance between the first hinge and the second hinge, a distance between the second hinge and the output end, and a distance between the second hinge and the first fastening pin are equal.

6. A finished board, comprising a mother board and a PCB, and further comprising:
    a carrier board that is disposed on the mother board in a slidable manner, wherein the PCB is disposed on the carrier board; and
    a plug mechanism that drives the carrier board to slide along a sliding direction of the carrier board, wherein the plug mechanism comprises:
    a tie bar comprising a first end and a second end, the first end forming an input end of the plug mechanism that moves along a first direction under an external force;
    a swing rod, wherein one end of the swing rod is hinge-connected to the second end of the tie bar by using a first hinge, and the other end of the swing rod forms an output end of the plug mechanism, wherein the output end moves along a second direction when the input end moves in the first direction, wherein the second direction is at an angle with the first direction, wherein the second direction is a plug direction of the PCB; and a connector for connecting the PCB is disposed at the output end, wherein in a process in which the output end moves along the second direction, the connector drives the PCB to perform a corresponding hot plug action, the input end of the plug mechanism is located on an external side of the mother board, and the output end of the plug mechanism is connected to the carrier board.

7. The finished board according to claim 5, wherein the plug mechanism specifically comprises:

wherein a first guiding mechanism is disposed on the tie bar, and an extended guiding direction of the first guiding mechanism is perpendicular to the plug direction of the PCB;

wherein the output end is hinge-connected to the carrier board by using a third fastening pin; and a position limiting rod, wherein one end of the position limiting rod is hinge-connected to the swing rod by using a second hinge, the other end of the position limiting rod is hinge-connected to the mother board by using a first fastening pin.

8. The finished board according to claim 7, wherein the first guiding mechanism comprises a first conduit provided on the tie bar and a second fastening pin that is disposed in the first conduit and can slide relative to the first conduit, and the second fastening pin is fastened on the mother board.

9. The finished board according to claim 8, wherein the first conduit is at least two segments that are provided in parallel.

10. The finished board according to claim 7, a distance between the first hinge and the second hinge, a distance between the second hinge and the output end, and a distance between the second hinge and the first fastening pin are equal.

11. The finished board according to claim 6, wherein several fourth fastening pins are disposed on the mother board, a second conduit cooperating with the fourth fastening pins is provided on the carrier board, and an extending direction of the second conduit is the same as the plug direction of the PCB.

12. The finished board according to claim 6, wherein several PCB card slots are provided on the carrier board, and the PCB is disposed on the carrier board by using the PCB card slots.

13. A subrack, comprising a subrack body, a guide rail disposed on a mother board of the subrack body, and a finished board cooperating with the guide rail on sliding, wherein the finished board is the finished board according to claim 6.

14. A finished board, comprising a mother board and a PCB, and further comprising:

a carrier board that is disposed on the mother board in a slidable manner, wherein the PCB is disposed on the carrier board;

a plug mechanism that drives the carrier board to slide along a sliding direction of the carrier board, wherein the plug mechanism comprises an input end that moves along a first direction under an external force and an output end that moves along a second direction when the input end moves, wherein the second direction is at an angle with the first direction, wherein the second direction is a plug direction of the PCB, and a connector for connecting the PCB is disposed at the output end, wherein in a process in which the output end moves along the second direction, the connector drives the PCB to perform a corresponding hot plug action, wherein an input end of the plug mechanism is located on an external side of the mother board, and an output end of the plug mechanism is connected to the carrier board; and a locking mechanism that is disposed on the mother board and configured to prevent the carrier board from automatically sliding off, wherein the locking mechanism specifically comprises:

a locking rod hinge-connected to the mother board, wherein one end of the locking rod is a clamp end, and the other end of the locking rod is a rotating driving end that extends externally to the mother board, and a clamp spring, wherein one end of the clamp spring is disposed on the mother board, the other end is pressed against the clamp end of the locking rod.

15. The finished board according to claim 14, wherein under an elastic effect of the clamp spring, the clamp end is fastened to a fastening end of a tie bar.

16. The finished board according to claim 15, wherein a convex hull is disposed on the mother board, and one end of the clamp spring is disposed on the mother board by passing through a fastening hole on the convex hull.

17. A subrack, comprising a subrack body, a guide rail disposed on a mother board of the subrack body, and a finished board cooperating with the guide rail on sliding, wherein the finished board is the finished board according to claim 15.

18. The subrack according to claim 17, wherein a contact convex pad cooperating with the rotating driving end on contacting is disposed on the subrack body, and after the finished board is installed in position along the guide rail, the rotating driving end gets in contact with the contact convex pad, bears a force, and makes the clamp end rotate until the clamp end is detached from the fastening end of the tie bar.

* * * * *